United States Patent
Kim et al.

(10) Patent No.: US 11,795,550 B2
(45) Date of Patent: Oct. 24, 2023

(54) ETCHING COMPOSITION, A METHOD OF ETCHING A METAL BARRIER LAYER AND A METAL LAYER USING THE SAME, AND METHOD OF MANUFACTURING SEMICONDUCTOR DEVICE USING THE SAME

(71) Applicant: SAMSUNG ELECTRONICS CO., LTD., Suwon-si (KR)

(72) Inventors: Jungah Kim, Hwaseong-si (KR); Mihyun Park, Sungnam-si (KR); Jinwoo Lee, Yongin-si (KR); Keonyoung Kim, Yongin-si (KR); Hyosan Lee, Hwaseong-si (KR); Hoon Han, Anyang-si (KR); Jin Uk Lee, Sejong-si (KR); Jung Hun Lim, Daejeon-si (KR)

(73) Assignees: SAMSUNG ELECTRONICS CO., LTD., Suwon-si (KR); SOULBRAIN CO., LTD., Seongnam-si (KR)

( * ) Notice: Subject to any disclaimer, the term of this patent is extended or adjusted under 35 U.S.C. 154(b) by 0 days.

(21) Appl. No.: 17/313,534

(22) Filed: May 6, 2021

(65) Prior Publication Data
US 2021/0254224 A1  Aug. 19, 2021

Related U.S. Application Data

(63) Continuation of application No. 16/574,372, filed on Sep. 18, 2019, now Pat. No. 11,028,488.

(30) Foreign Application Priority Data

Sep. 18, 2018  (KR) .......................... 10-2018-0111342

(51) Int. Cl.
*C23F 1/26* (2006.01)
*C23F 1/30* (2006.01)
(Continued)

(52) U.S. Cl.
CPC ............ *C23F 1/26* (2013.01); *B81C 1/00539* (2013.01); *C09K 13/04* (2013.01); *C23F 1/30* (2013.01);
(Continued)

(58) Field of Classification Search
None
See application file for complete search history.

(56) References Cited

U.S. PATENT DOCUMENTS 7,582,127 B2   9/2009   Vacassy et al.
9,530,670 B2  12/2016   Han et al.
(Continued)

FOREIGN PATENT DOCUMENTS

CN   100350570   * 11/2007  ................ C23F 1/20
CN   102753651 A   10/2012
(Continued)

*Primary Examiner* — Jiong-Ping Lu
(74) *Attorney, Agent, or Firm* — Sughrue Mion, PLLC

(57) ABSTRACT

A method of etching a metal barrier layer and a metal layer is provided. The method includes forming the metal barrier layer and the metal layer on a substrate, and using an etching composition to etch the metal barrier layer and the metal layer. The etching composition may include an oxidant selected from nitric acid, bromic acid, iodic acid, perchloric acid, perbromic acid, periodic acid, sulfuric acid, methane sulfonic acid, p-toluenesulfonic acid, benzenesulfonic acid, or a combination thereof, a metal etching inhibitor including a compound expressed by Chemical Formula 1, and a metal oxide solubilizer selected from phosphoric acid, phosphate, carboxylic acid having 3 to 20 carbon atoms, or a combination thereof.

6 Claims, 15 Drawing Sheets

(51) Int. Cl.
  *H01L 21/311* (2006.01)
  *H01L 21/306* (2006.01)
  *B81C 1/00* (2006.01)
  *C09K 13/04* (2006.01)
(52) U.S. Cl.
  CPC .. *H01L 21/30604* (2013.01); *H01L 21/31111* (2013.01)

(56) References Cited

U.S. PATENT DOCUMENTS

| | | | |
|---|---|---|---|
| 10,005,991 | B2 | 6/2018 | Cui |
| 10,155,921 | B2 | 12/2018 | Cui |
| 10,392,560 | B2 | 8/2019 | Barnes et al. |
| 10,472,567 | B2 | 11/2019 | Chen et al. |
| 10,538,846 | B2 | 1/2020 | Kim et al. |
| 2007/0087580 | A1* | 4/2007 | Kang ............... H01L 21/02079 438/778 |
| 2011/0070708 | A1 | 3/2011 | Hsieh |
| 2013/0026134 | A1 | 1/2013 | Nakagawa et al. |
| 2013/0273745 | A1 | 10/2013 | Shim |
| 2015/0104952 | A1 | 4/2015 | Cui |
| 2015/0175943 | A1 | 6/2015 | Casteel, Jr. et al. |
| 2015/0259573 | A1 | 9/2015 | Grumbine et al. |
| 2016/0254182 | A1* | 9/2016 | Cui ..................... C11D 7/3209 134/2 |
| 2016/0351417 | A1 | 12/2016 | Akeboshi et al. |
| 2018/0204764 | A1* | 7/2018 | Cooper .................. G03F 7/425 |

FOREIGN PATENT DOCUMENTS

| | | |
|---|---|---|
| CN | 104145324 A | 11/2014 |
| CN | 104730870 A | 6/2015 |
| CN | 105102584 A | 11/2015 |
| CN | 105374826 A | 3/2016 |
| CN | 105874568 A | 8/2016 |
| CN | 106868511 A | 6/2017 |
| CN | 107564915 A | 1/2018 |
| CN | 108359987 A | 8/2018 |
| JP | 2013-237873 A | 11/2013 |
| KR | 10-0603136 B1 | 7/2006 |
| KR | 10-2015-0050278 A | 5/2015 |
| KR | 10-2016-0068903 A | 6/2016 |
| WO | 03/036707 A1 | 5/2003 |
| WO | 2019/041892 A1 | 3/2019 |

* cited by examiner

ETCHING COMPOSITION, A METHOD OF ETCHING A METAL BARRIER LAYER AND A METAL LAYER USING THE SAME, AND METHOD OF MANUFACTURING SEMICONDUCTOR DEVICE USING THE SAME

CROSS-REFERENCE TO RELATED APPLICATION

This application is a continuation of U.S. application Ser. No. 16/574,372 filed Sep. 18, 2019, which claims priority under 35 U.S.C § 119 to Korean Patent Application No. 10-2018-0111342 filed on Sep. 18, 2018, in the Korean Intellectual Property Office, the disclosures of which are incorporated herein by reference in their respective entireties.

BACKGROUND

The present disclosure relates to an etching composition, a method of etching a metal barrier layer and a metal layer using the same, and a method of manufacturing a semiconductor device using the same.

Semiconductor devices are widely used in the electronic industry because of their small size, multi-functionality, and/or low manufacturing cost. Semiconductor devices may encompass a memory device for storing data, a logic device for processing data, and a hybrid device for operating various functions contemporaneously or simultaneously.

Semiconductor devices have been increasingly required for high integration with the advanced development of the electronic industry. It therefore is increasingly difficult to manufacture semiconductor devices because there is a problem of process margin reduction in an exposure process defining fine patterns. Semiconductor devices also have been increasingly requested for high speed with the advanced development of the electronic industry. Various studies have been conducted to meet the requirements of high integration and/or high speed in semiconductor devices.

SUMMARY

Some exemplary embodiments of the present disclosure provide an etching composition capable of effectively etching a metal barrier layer and a metal layer, and a method of manufacturing a semiconductor device using the etching composition.

According to some exemplary embodiments of the present disclosure, a method of etching a metal barrier layer and a metal layer may include forming a metal barrier layer and a metal layer on a substrate; and using an etching composition to etch the metal barrier layer and the metal layer. In these exemplary embodiments, the etching composition may include: an oxidant selected from nitric acid, bromic acid, iodic acid, perchloric acid, perbromic acid, periodic acid, sulfuric acid, methane sulfonic acid, p-toluenesulfonic acid, benzenesulfonic acid, or a combination thereof; a metal etching inhibitor including a compound expressed by Chemical Formula 1 below; and a metal oxide solubilizer selected from phosphoric acid, phosphate, carboxylic acid having 3 to 20 carbon atoms, or a combination thereof.

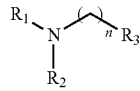

[Chemical Formula 1]

In Chemical Formula 1, $R_1$ and $R_2$ are independently hydrogen, (C1-C10) alkyl, (C3-C10) alkenyl, (C3-C10) alkynyl, (C1-C10) alkoxy, or carboxyl, $R_3$ is hydrogen, amino, (C1-C10) alkylamino, (C3-C10) arylamino, (C1-C10) alkyl, (C3-C10) alkenyl, (C3-C10) alkynyl, (C1-C10) alkoxy, or carboxyl, n is an integer equal to or greater than 1, and $R_1$, $R_2$ and $R_3$ can be unsubstituted or substituted.

According to some exemplary embodiments of the present disclosure, a method of etching a titanium nitride layer and a tungsten layer may include forming the titanium nitride layer and the tungsten layer on a substrate; and using an etching composition to etch the titanium nitride layer and the tungsten layer. In these exemplary embodiments, the etching composition may include: an oxidant selected from nitric acid, bromic acid, iodic acid, perchloric acid, perbromic acid, periodic acid, sulfuric acid, methane sulfonic acid, p-toluenesulfonic acid, benzenesulfonic acid, or a combination thereof; a metal etching inhibitor including an amine-based compound having one or two amino groups; and a metal oxide solubilizer selected from phosphoric acid, phosphate, carboxylic acid having 3 to 20 carbon atoms, or a combination thereof.

According to some exemplary embodiments of the present disclosure, a method of manufacturing a semiconductor device may comprise: forming sacrificial layers and dielectric layers that are alternately and repeatedly stacked on a substrate; selectively removing the sacrificial layers to form recess regions; forming a metal barrier layer and a metal layer that fill the recess regions; and using an etching composition to partially etch the metal barrier layer and the metal layer to form a metal barrier pattern and a metal pattern in each of the recess regions. In these exemplary embodiments, the etching composition may include: an oxidant selected from nitric acid, bromic acid, iodic acid, perchloric acid, perbromic acid, periodic acid, sulfuric acid, methane sulfonic acid, p-toluenesulfonic acid, benzenesulfonic acid, or a combination thereof; a metal etching inhibitor including an amine-based compound having one or two amino groups; and a metal oxide solubilizer selected from phosphoric acid, phosphate, carboxylic acid having 3 to 20 carbon atoms, or a combination thereof.

BRIEF DESCRIPTION OF THE DRAWINGS

Features of exemplary embodiments of the present disclosure will be described below with reference to the accompanying drawings, in which like numerals denote like elements, and wherein.

DETAILED DESCRIPTION OF EMBODIMENTS

Figure 1:
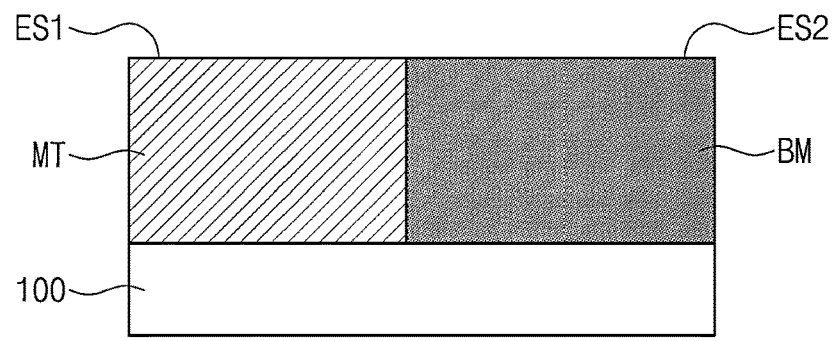
FIGS. 1 to 3 illustrate cross-sectional views showing a method of etching a metal layer and a metal barrier layer, according to some exemplary embodiments of the present disclosure.
Figure 2:
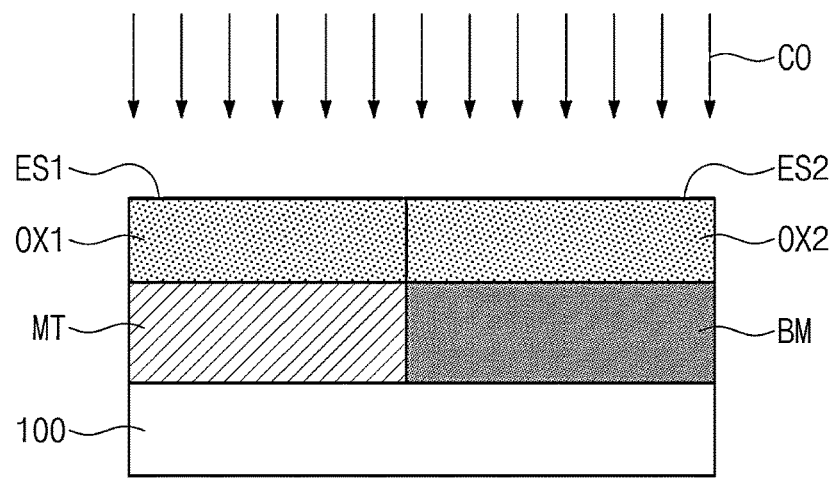
Figure 3:
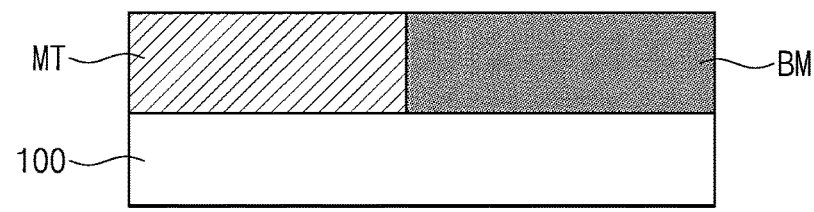

FIGS. 1 to 3 illustrate cross-sectional views showing a method of etching a metal layer and a metal barrier layer, according to some example embodiments of the present disclosure.

Referring to FIG. 1, a metal layer MT and a metal barrier layer BM may be formed on a substrate 100. The metal barrier layer BM may be adjacent to the metal layer MT. The metal layer MT may have a first etching-target surface ES1, and the metal barrier layer BM may have a second etching-target surface ES2. The first and second etching-target surfaces ES1 and ES2 may be surfaces to which is applied an etching composition CO, which will be discussed below, according to some example embodiments of the present disclosure. For example, the first and second etching-target surfaces ES1 and ES2 may be substantially coplanar with each other.

The metal layer MT may include one or more of aluminum, copper, molybdenum, and cobalt. The metal barrier layer BM may be a metal nitride layer, which may include one or more of a titanium nitride (TiN) layer, a tantalum nitride (TaN) layer, a tungsten nitride (WN) layer, a nickel nitride (NiN) layer, a cobalt nitride (CoN) layer, and a platinum nitride (PtN) layer.

Referring to FIG. 2, an etching composition CO according to some exemplary embodiments of the present disclosure may be applied onto the metal layer MT and the metal barrier layer BM. The etching composition CO may be directly applied onto the first and second etching-target surfaces ES1 and ES2. The etching composition CO may include an oxidant, a metal etching inhibitor, a metal oxide solubilizer, and water.

The oxidant may oxidize the metal layer MT and the metal barrier layer BM. The oxidant may be selected from nitric acid, bromic acid, iodic acid, perchloric acid, perbromic acid, periodic acid, sulfuric acid, methanesulfonic acid, p-toluenesulfonic acid, benzenesulfonic acid, or a combination thereof.

The metal etching inhibitor may inhibit the oxidant from acting on the metal layer MT. The metal etching inhibitor may be an amine-based compound having one or two amino groups in a single molecule. The metal etching inhibitor may include a compound expressed by Chemical Formula 1 below.

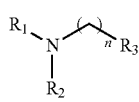

[Chemical Formula 1]

$R_1$ and $R_2$ may independently be hydrogen, (C1-C10) alkyl, (C3-C10) alkenyl, (C3-C10) alkynyl, (C1-C10) alkoxy, or carboxyl. The alkyl, alkenyl, alkynyl, or alkoxy may be unsubstituted or substituted with carboxyl or hydroxy.

$R_3$ may be hydrogen, amino, (C1-C10) alkylamino, (C3-C10) arylamino, (C1-C10) alkyl, (C3-C10) alkenyl, (C3-C10) alkynyl, (C1-C10) alkoxy, or carboxyl. The amino, alkylamino, arylamino, alkyl, alkenyl, alkynyl, or alkoxy may be unsubstituted or substituted with carboxyl or hydroxy.

In Chemical Formula 1, n is an integer equal to or more than 1.

The compound expressed by Chemical Formula 1 may have one or two amino groups in a molecule thereof. For example, the compound expressed by Chemical Formula 1 may have one or two nitrogen atoms.

For example, the metal etching inhibitor may include ethylenediaminediacetate (EDADA), ethylenediaminetetraacetic acid (EDATAA), ethylenediamine (EDA), m-xylenediamine (MXDA), methyldiethanolamine (MDEA), dimethylmonoethanolamine (DMMEA), ethyldiethanolamine (EDEA), diethylmonoethanolamine (DEMEA), triethylamine (TEA), or tributylamine (TBA).

The metal oxide solubilizer may have a boiling point of 90° C. to 200° C. at 1 atmosphere pressure. The metal oxide solubilizer may be an acid whose oxidizing power for the metal layer MT and the metal barrier layer BM is less than that of the oxidant. For example, the metal oxide solubilizer may be selected from phosphoric acid, phosphate, carboxylic acid having 3 to 20 carbon atoms, or a combination thereof.

The amount of the oxidant may be from 10% to 30% by weight relative to the total weight of the etching composition CO. When the amount of the oxidant is less than 10 wt %, an etch rate may be reduced due to a reduction in oxidation rate for the metal layer MT and the metal barrier layer BM. When the amount of the oxidant is greater than 30 wt %, the oxidant may be excessively used and thus the etching composition CO may decrease in economic efficiency. In certain embodiments, the oxidant may have an amount of 15 wt % to 25 wt %.

The amount metal etching inhibitor may be from 0.01% to 10% by weight relative to the total weight of the etching composition CO. When the amount of the metal etching inhibitor is less than 0.01 wt %, it may be difficult to reduce an etch rate of the metal layer MT. When the amount of the metal etching inhibitor is greater than 10 wt %, an etch rate of the metal layer MT may be significantly reduced to have difficulty in achieving an etch selectivity which will be discussed below. In certain embodiments, the amount of the metal etching inhibitor may be from 0.1 wt % to 3 wt %.

The amount of water may be from 10% to 30% by weight relative to the total weight of the etching composition CO. The metal oxide solubilizer may occupy the remainder of the etching composition CO. The water may be a pure or ionized water.

The etching composition CO may further include an assistant oxidant, a pH adjustor, or a surfactant. The assistant oxidant may increase oxidation rates of the metal layer MT and the metal barrier layer BM. The assistant oxidant may include an acid ammonium-based compound, a halogen acid-compound, or a sulfuric acid-based compound. The acid ammonium-based compound may include, for example, ammonium sulfate, ammonium persulfate, ammonium acetate, ammonium phosphate, or ammonium chloride. The halogen acid-based compound may include, for example, periodic acid or iodic acid. The sulfuric acid-based compound may include, for example, sulfuric acid, methanesulfonic acid, or p-tolunesulfonic acid. The compounds discussed as the assistant oxidant may be used either alone or in combination of two or more.

The pH adjustor may adjust the pH of the etching composition CO. The pH adjustor may include, for example, one or more of ammonia, an amine, or a nitrogen-containing heterocyclic compound.

The surfactant may remove byproducts (or residues) produced in an etching process. The surfactant may include an anionic surfactant (e.g., $C_8H_{17}COOH$), a cationic surfactant (e.g., $C_8H_{17}NH_2$), or a non-ionic surfactant (e.g., polyoxyalkylenealkylether).

The oxidant in the etching composition CO may oxidize the metal layer MT and the metal barrier layer BM, and accordingly, a first metal oxide layer OX1 and a second metal oxide layer OX2 may be formed respectively on the metal layer MT and the metal barrier layer BM.

The oxidant may oxidize the metal layer MT faster than the metal barrier layer BM. The metal etching inhibitor may cover and protect the first etching-target surface ES1 of the metal layer MT, and thus may prevent the oxidant from oxidizing the metal layer MT.

Referring to FIG. 3, the metal oxide solubilizer and the water in the etching composition CO may dissolve the first and second metal oxide layers OX1 and OX2, which may result in removal of the first and second oxide layers OX1 and OX2. The etching composition CO according to some example embodiments of the present disclosure may oxidize and dissolve the metal layer MT and the metal barrier layer BM, with the result that the metal layer MT and the metal barrier layer BM may be etched.

For example, the etching composition CO may use the metal etching inhibitor to achieve an etch selectivity ranging from 1.0 to 2.0. The etch selectivity is a ratio of an etch rate of the metal layer MT to an etch rate of the metal barrier layer BM.

The metal layer MT and the metal barrier layer BM discussed with reference to FIGS. 1 to 3 may be etched, for example, for 20 minutes to 100 minutes at a temperature of 50° C. to 70° C.

In certain embodiments, a wet etching process may be performed at a high temperature greater than room temperature (e.g., about 25° C.). When the wet etching process is executed at high temperatures, the metal layer MT and the metal barrier layer BM may be etched at high rates. Because the metal oxide solubilizer in the etching composition (CO) has a relatively high melting point, it may be possible to avoid volatilization during the wet etching process.

Embodiments 1 to 3 and Comparatives 1 and 2

Below is Table 1 that lists ingredients of etching compositions according to Embodiments 1 to 3 and of etching compositions according to Comparatives 1 and 2, and also lists etching process temperatures.

TABLE 1

| Ingredient | Embodiment 1 | Embodiment 2 | Embodiment 3 | Comparative 1 | Comparative 2 |
|---|---|---|---|---|---|
| Process Temp. (° C.) | 68 | 68 | 68 | 68 | 70 |
| Metal Oxide Solubilizer (phosphoric acid) | 65.8 | 65.8 | 65.8 | 65.8 | 72 |
| Oxidant (nitric acid) | 16.5 | 16.5 | 16.5 | 16.5 | 1.9 |
| Metal Etching Inhibitor | EDADA 0.5 | MXDA 0.5 | MXDA 1 | — | — |
| Acetic acid | — | — | — | — | 13.6 |
| Water | Bal. | Bal. | Bal. | Bal. | Bal. |
| Sum total (wt %) | 100 | 100 | 100 | 100 | 100 |

Experiment 1

The following method estimated the etching compositions of Embodiments 1 to 3 and of Comparatives 1 and 2, and their results are presented in Table 2 below.

An etching composition was applied onto a tungsten layer (metal layer) of a certain thickness. An etching process was performed for 30 minutes, and then the thickness of the tungsten layer was measured to determine the etch rate. The measurement of layer thickness was performed using X-ray fluorescence (XRF).

In addition, an etching composition was applied onto a titanium nitride layer (metal barrier layer) of a certain thickness. An etching process was performed for 30 minutes, and then the thickness of the titanium nitride layer was measured to determine the etch rate. The measurement of layer thickness was performed using X-ray fluorescence (XRF).

TABLE 2

| | Etch rate of tungsten layer ($V_W$) (Å/min) | Etch rate of titanium nitride layer ($V_{TiN}$) (Å/min) | Etch Selectivity ($V_W/V_{TiN}$) |
|---|---|---|---|
| Embodiment 1 | 6.06 | 4.13 | 1.47 |
| Embodiment 2 | 6.86 | 4.17 | 1.65 |
| Embodiment 3 | 6.46 | 4.23 | 1.53 |
| Comparative 1 | 8.60 | 4.20 | 2.05 |
| Comparative 2 | 6.08 | 4.16 | 1.46 |

Referring to Table 2, because the etching composition of Comparative 1 did not contain the metal etching inhibitor, it may be ascertained that the etch rate of the tungsten layer was greater than twice the etch rate of the titanium nitride layer.

Experiment 2

To realize volatilization and condensation of the water during an etching process, a glass was equipped on an upper portion of an etching bath. The following method estimated the etching compositions of Embodiments 1 to 3 and Comparative 2, and their results are presented in Table 3 below.

An etching composition was applied onto a tungsten layer (metal layer). An etching process was performed for 30 minutes, and then a thickness of the tungsten layer was measured. Afterwards, the thickness of the tungsten layer was measured at every 3 hours for 12 hours. The measurement of layer thickness was performed using X-ray fluorescence (XRF).

In addition, an etching composition was applied onto a titanium nitride layer (metal barrier layer). An etching process was performed for 30 minutes, and then a thickness of the titanium nitride layer was measured. Afterwards, the thickness of the titanium nitride layer was measured at every 3 hours for 12 hours. The measurement of layer thickness was performed using X-ray fluorescence (XRF).

TABLE 3

| | Time | Etch rate of tungsten layer ($V_W$) (Å/min) | Etch rate of titanium nitride layer ($V_{TiN}$) (Å/min) | Etch Selectivity ($V_W/V_{TiN}$) |
|---|---|---|---|---|
| Embodiment 1 | 30 minutes | 6.06 | 4.13 | 1.47 |
| | 3 hours | 6.12 | 4.1 | 1.49 |
| | 6 hours | 6.1 | 4.12 | 1.48 |
| | 9 hours | 6.03 | 4.08 | 1.48 |
| | 12 hours | 5.93 | 4.04 | 1.47 |
| Embodiment 2 | 30 minutes | 6.86 | 4.17 | 1.65 |
| | 3 hours | 6.84 | 4.15 | 1.65 |
| | 6 hours | 6.76 | 4.16 | 1.63 |
| | 9 hours | 6.68 | 4.10 | 1.63 |
| | 12 hours | 6.60 | 4.05 | 1.63 |
| Embodiment 3 | 30 minutes | 6.46 | 4.23 | 1.53 |
| | 3 hours | 6.38 | 4.21 | 1.52 |
| | 6 hours | 6.35 | 4.13 | 1.54 |
| | 9 hours | 6.28 | 4.13 | 1.52 |
| | 12 hours | 6.19 | 4.08 | 1.52 |
| Comparative 2 | 30 minutes | 6.11 | 4.26 | 1.43 |
| | 3 hours | 5.97 | 4.23 | 1.41 |
| | 6 hours | 5.83 | 4.22 | 1.38 |
| | 9 hours | 5.67 | 4.18 | 1.36 |
| | 12 hours | 5.37 | 4.15 | 1.29 |

Referring to Table 2 or results of Experiment 1, it may be ascertained that the etching compositions, containing the metal etching inhibitor, of Embodiments 1 to 3 had a reduced etch rate of the tungsten layer, compared to the etching composition of Comparative 1. In this sense, the etch rate of the tungsten layer may be reduced by adjusting an amount and kind of the metal etching inhibitor in the etching composition according to the present disclosure. For example, it may be possible to adjust a ratio of the etch rate of the tungsten layer to the etch rate of the titanium nitride layer.

Referring Table 3 or results of Experiment 2, the etch rate of the tungsten layer by the etching composition of Comparative 2 was gradually reduced between 30 minutes and 12 hours. In this sense, the etch selectivity of the etching composition of Comparative 2 was gradually reduced between 30 minutes and 12 hours. In contrast, it may be ascertained that the etch rate of the tungsten layer by the etching compositions of Embodiments 1 to 3 was relatively uniformly maintained between 30 minutes and 12 hours. For example, the etch selectivity of the etching compositions of Embodiments 1 to 3 was uniformly maintained during the etching process.

FIGS. 4 to 14 illustrate cross-sectional views showing a method of manufacturing a semiconductor device, according to some example embodiments of the present disclosure. FIG. 15 illustrates a perspective view showing the semiconductor device depicted in FIG. 14.

Figure 4:
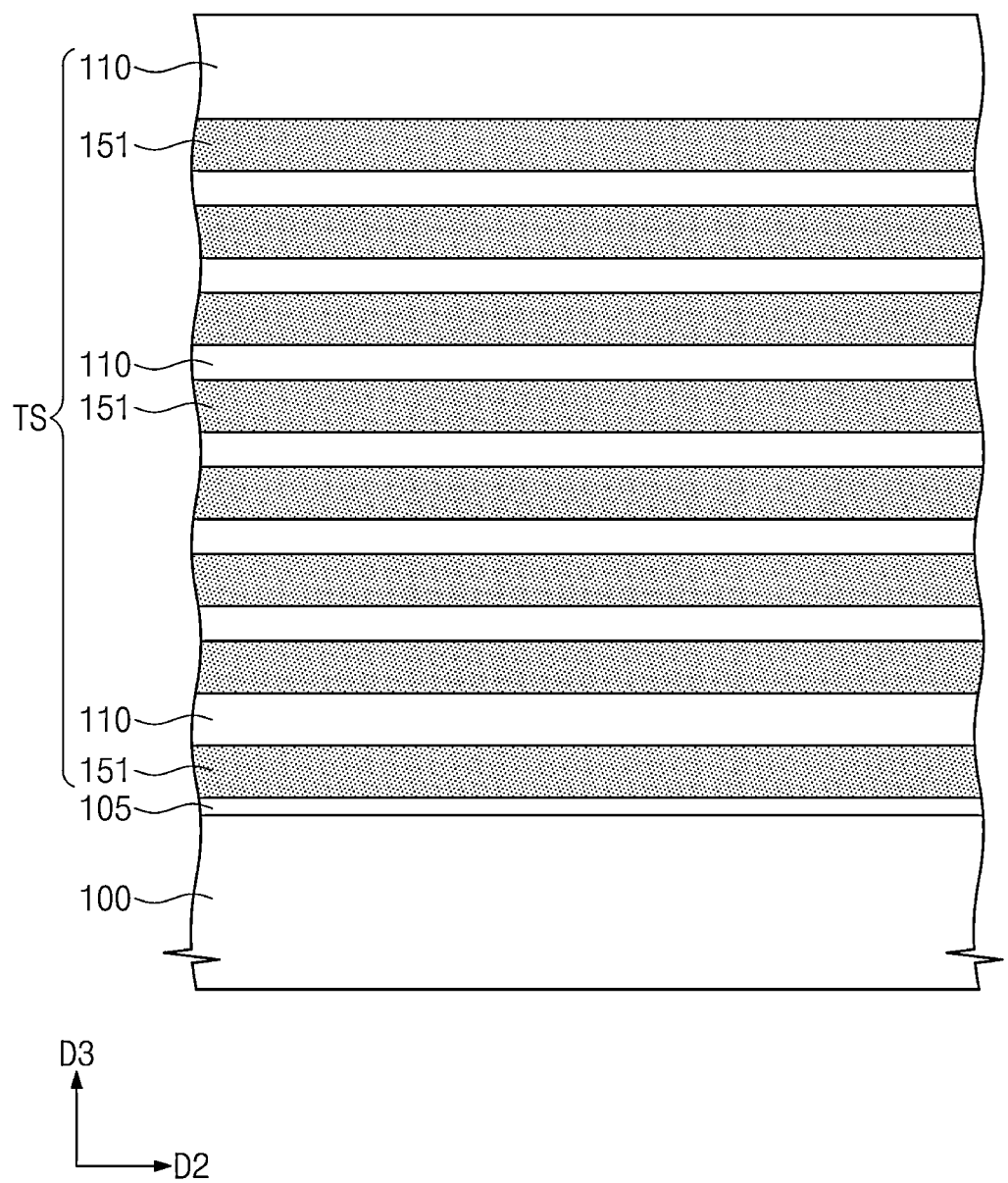
FIGS. 4 to 14 illustrate cross-sectional views showing a method of manufacturing a semiconductor device, according to some exemplary embodiments of the present disclosure.

Referring to FIG. 4, a thin-layer structure TS may be formed by alternately and repeatedly depositing sacrificial layers 151 and dielectric layers 110 on a substrate 100. The substrate 100 may be, for example, a silicon substrate, a germanium substrate, or a silicon-germanium substrate. The sacrificial layers 151 may be formed, for example, of a silicon nitride layer, a silicon oxynitride layer, or a silicon layer. The dielectric layers 110 may be formed, for example, of a silicon oxide layer. The sacrificial layers 151 and the dielectric layers 110 may be deposited, for example, using thermal chemical vapor deposition (CVD), plasma enhanced CVD, physical CVD process, or atomic layer deposition (ALD).

A lower dielectric layer 105 may be formed between the substrate 100 and the thin-layer structure TS. The lower dielectric layer 105 may be formed of a material whose etch selectivity is high with respect to the sacrificial layers 151 and the dielectric layers 110. For example, the lower dielectric layer 105 may include a high-k dielectric layer, such as, for example, a silicon nitride layer, an aluminum oxide layer, or a hafnium oxide layer. The lower dielectric layer 105 may be formed to have a thickness less than those of the sacrificial layers 151 and the dielectric layers 110.

Figure 5:
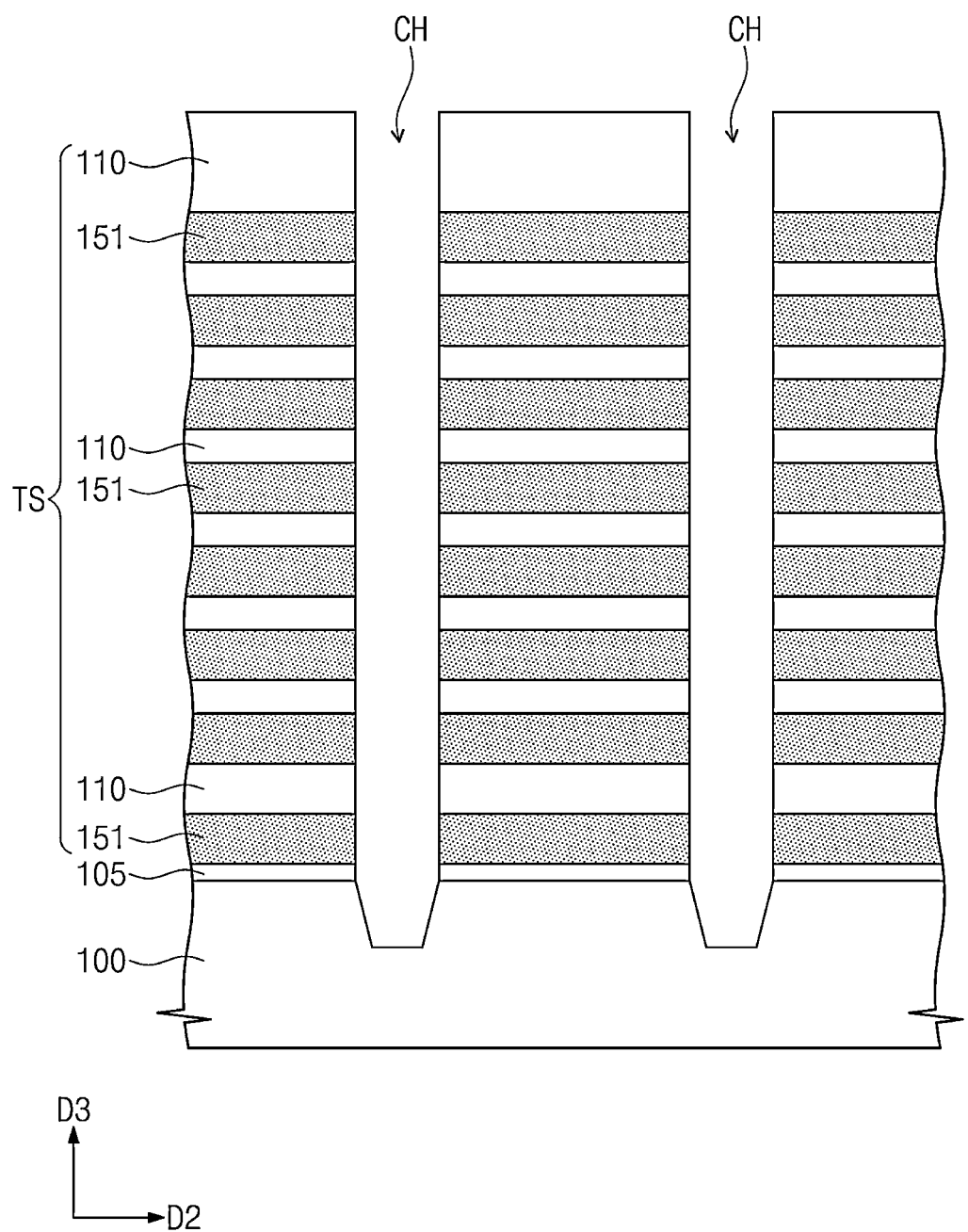

Referring to FIG. 5, channel holes CH may be formed to penetrate the thin-layer structure TS and to expose the substrate 100. The formation of the channel holes CH may include forming on the thin-layer structure TS a first mask pattern (not shown) having openings that define areas where the channel holes CH are formed, and performing an etching process in which the first mask pattern is used as an etching mask to etch the thin-layer structure TS. A top surface of the substrate 100 may be over-etched during the etching process. Accordingly, the top surface of the substrate 100 may be recessed. After the channel holes CH are formed, the first mask pattern may be removed.

Figure 6:
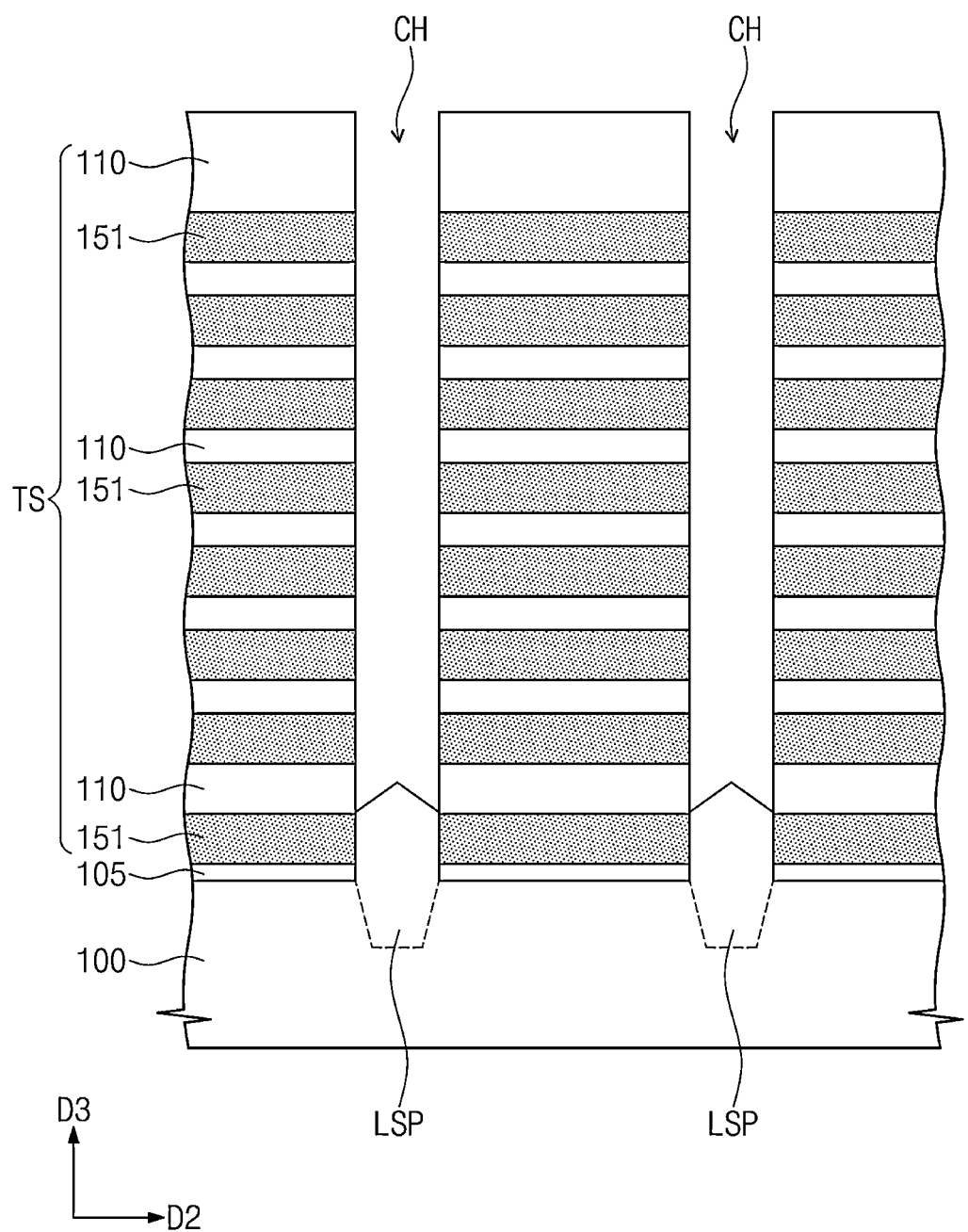

Referring to FIG. 6, lower semiconductor patterns LSP may be formed to fill lower portions of the channel holes CH. The lower semiconductor patterns LSP may be formed, for example, by a selective epitaxial growth (SEG) process in which the substrate 100 exposed to the channel holes CH is used a seed.

Each of the lower semiconductor patterns LSP may be formed in the shape of a pillar that protrudes from the substrate 100 and fills the lower portion of the channel hole CH. The lower semiconductor pattern LSP may cover a sidewall of a lowermost sacrificial layer 151.

The lower semiconductor patterns LSP may include a semiconductor material whose conductive type is the same as that of a semiconductor material of the substrate 100. For example, when the selective epitaxial growth process is performed, the lower semiconductor patterns LSP may be in-situ doped with impurities. For another example, after the selective epitaxial growth process is performed, the lower semiconductor patterns LSP may be ion-implanted with impurities. The lower semiconductor patterns LSP may include a semiconductor material, such as silicon, having a single crystalline structure or a polycrystalline structure.

Figure 7:
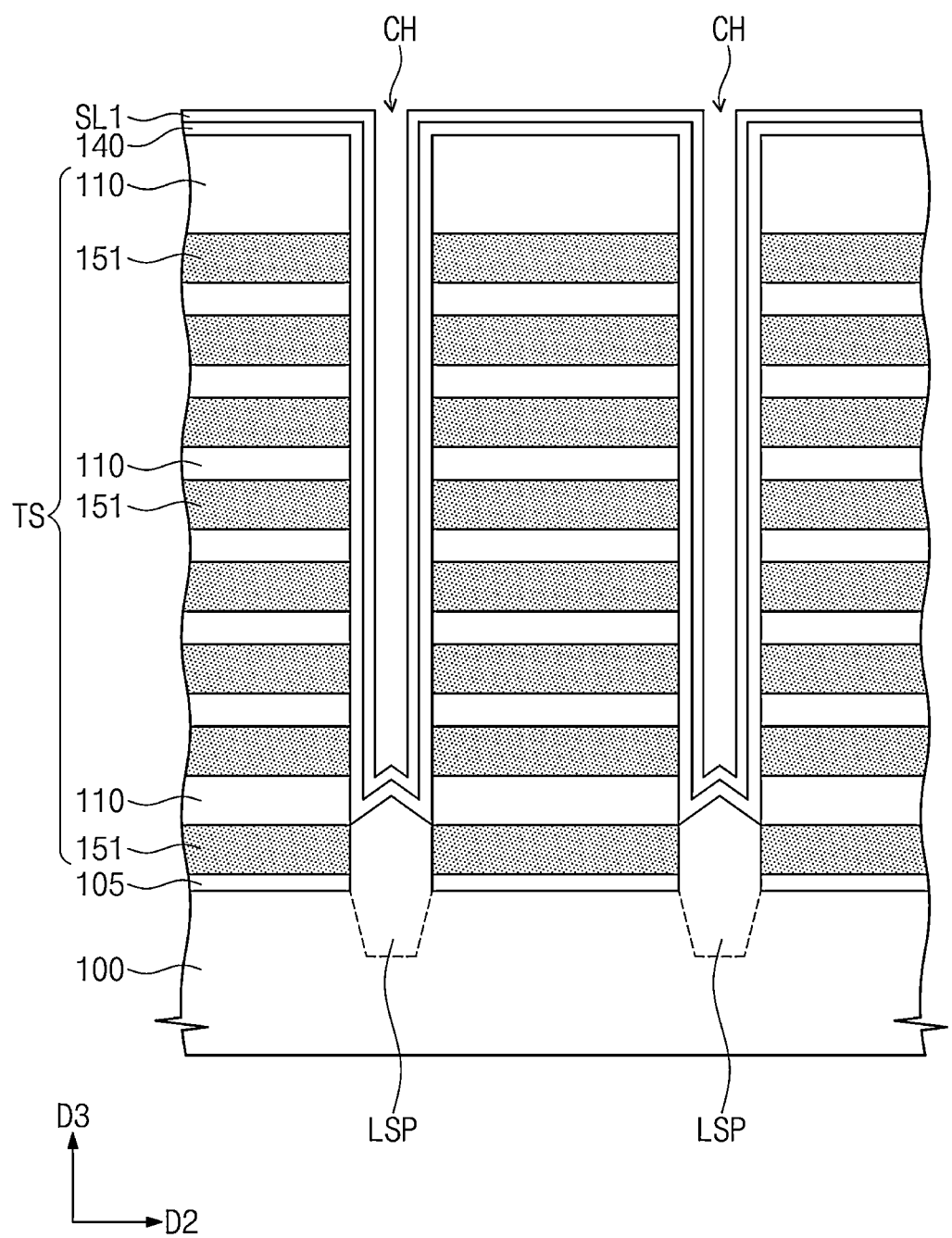

Referring to FIG. 7, a vertical dielectric layer 140 and a first semiconductor layer SL1 may be sequentially formed on inner sidewalls of the channel holes CH. The vertical dielectric layer 140 and the first semiconductor layer SL1 may partially fill each of the channel holes CH. The channel hole CH may not be completely filled with the vertical dielectric layer 140 and the first semiconductor layer SL1.

In certain embodiments, the formation of the vertical dielectric layer 140 may include, for example, sequentially forming a blocking dielectric layer, a charge storage layer, and a tunnel dielectric layer on the inner sidewall of each of the channel holes CH. The blocking dielectric layer may be formed, for example, of one or more of a silicon oxide layer, a silicon nitride layer, and a silicon oxynitride layer. The charge storage layer may be formed, for example, of one or more of a silicon nitride layer, a silicon oxynitride layer, a silicon-rich nitride layer, a nano-crystalline silicon layer, and a laminated trap layer. The tunnel dielectric layer may be formed, for example, of a silicon oxide layer.

The first semiconductor layer SL1 may include a semiconductor material having a single crystalline structure or a polycrystalline structure. For example, the first semiconductor layer SL1 may be formed of a polycrystalline silicon layer, a single crystalline silicon layer, or an amorphous silicon layer. The first semiconductor layer SL1 may be formed, for example, using atomic layer deposition or chemical vapor deposition.

Figure 8:
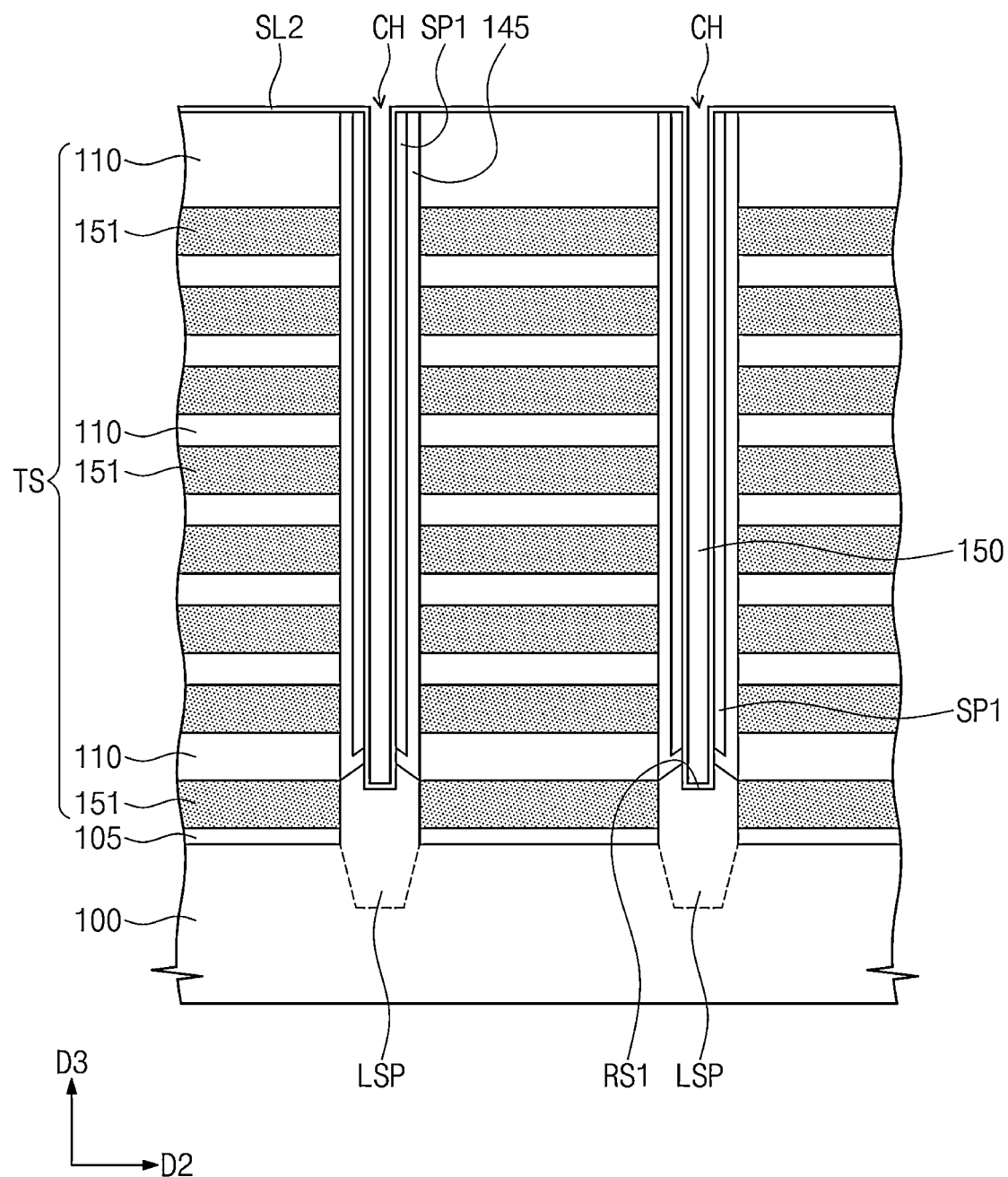

Referring to FIG. 8, the first semiconductor layer SL1 and the vertical dielectric layer 140 may be anisotropically etched to form a first semiconductor pillar SP1 and a vertical insulator 145 in each of the channel holes CH. Each of the first semiconductor pillar SP1 and the vertical insulator 145 may be formed in the shape of a pipe whose top and bottom ends are opened. The first semiconductor pillar SP1 and the vertical insulator 145 may partially expose the lower semiconductor pattern LSP.

When the first semiconductor layer SL1 and the vertical dielectric layer 140 are anisotropically etched, an over-etching may occur to form first recess regions RS1 on corresponding lower semiconductor patterns LSP.

A second semiconductor layer SL2 may be formed in the channel holes CH. The second semiconductor layer SL2 may be conformally formed not to completely fill each of the channel holes CH. The second semiconductor layer SL2 may partially fill each of the first recess regions RS1. The second semiconductor layer SL2 may electrically connect the lower semiconductor pattern LSP to the first semiconductor pillar SP1. The second semiconductor layer SL2 may include a semiconductor material having a single crystalline structure or a polycrystalline structure. For example, the second semiconductor layer SL2 may be formed of a polycrystalline silicon layer, a single crystalline silicon layer, or an amorphous silicon layer. The second semiconductor layer SL2 may be formed, for example, using atomic layer deposition or chemical vapor deposition.

Figure 9:
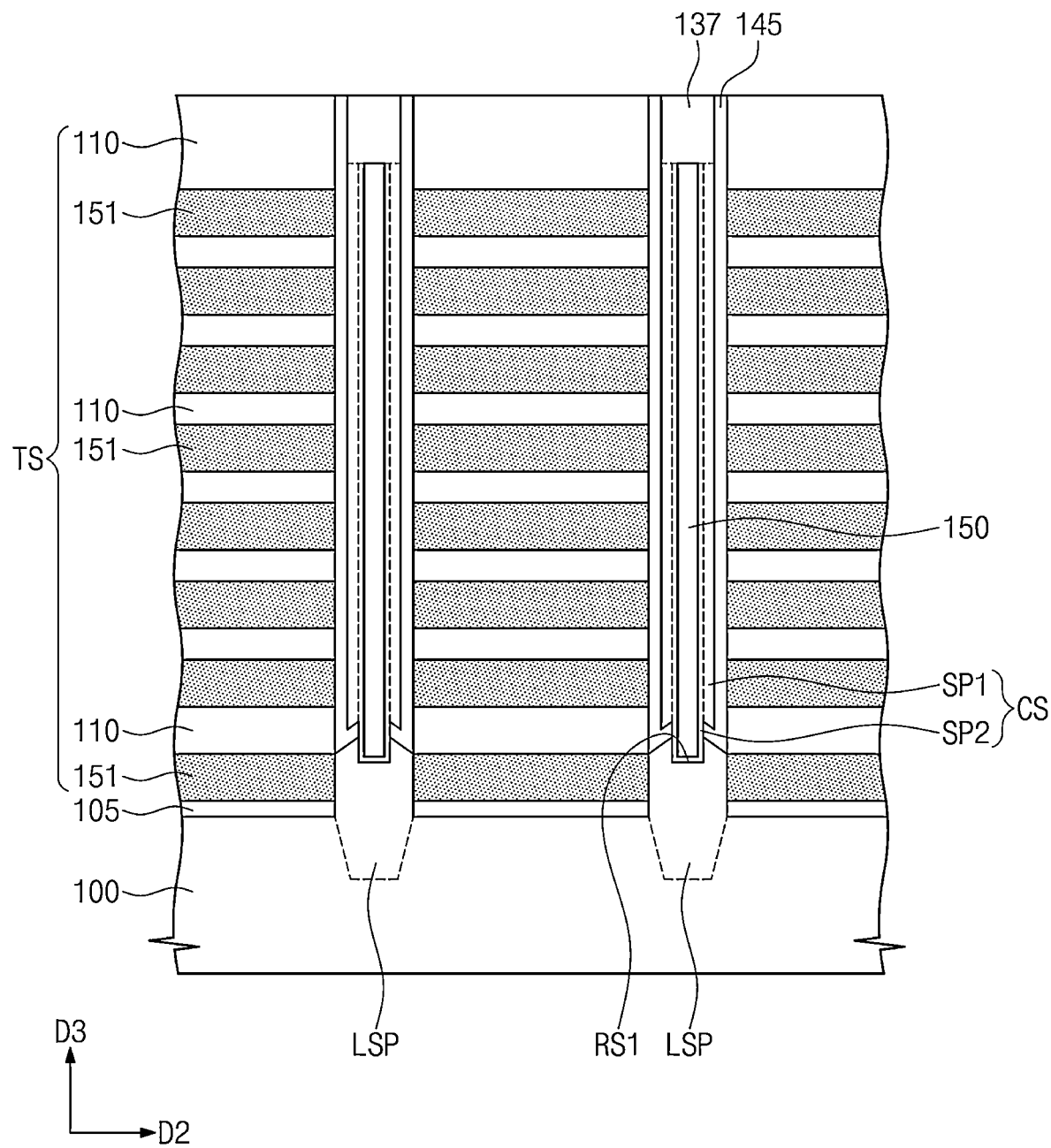

Referring to FIG. 9, a buried dielectric layer may be formed to completely fill each inside of the channel holes CH. The buried dielectric layer may be, for example, a silicon oxide layer formed by an SOG (or spin-on glass) technique. Upper portions of the second semiconductor layer SL2 and the buried dielectric layer may be recessed to form a second semiconductor pillar SP2 and a buried dielectric pattern 150 in each of the channel holes CH. The first semiconductor pillar SP1 may also be recessed together with the second semiconductor layer SL2. The first and second semiconductor pillars SP1 and SP2 may constitute a channel structure CS.

The second semiconductor pillar SP2 may be formed to have a pipe shape whose one end is closed, a hollow cylindrical shape whose one end is closed, or a cup shape. The buried dielectric pattern 150 may be formed to have a bar shape that fills an inside of the channel hole CH.

Conductive pads 137 may be formed to have connection with corresponding channel structures CS. The conductive pads 137 may be formed by filling recessed portions of the channel structures CS and buried dielectric patterns with a conductive material. For example, the conductive pads 137 may be formed of silicon doped with impurities whose conductive type is the same as that of the substrate 100.

Figure 10:
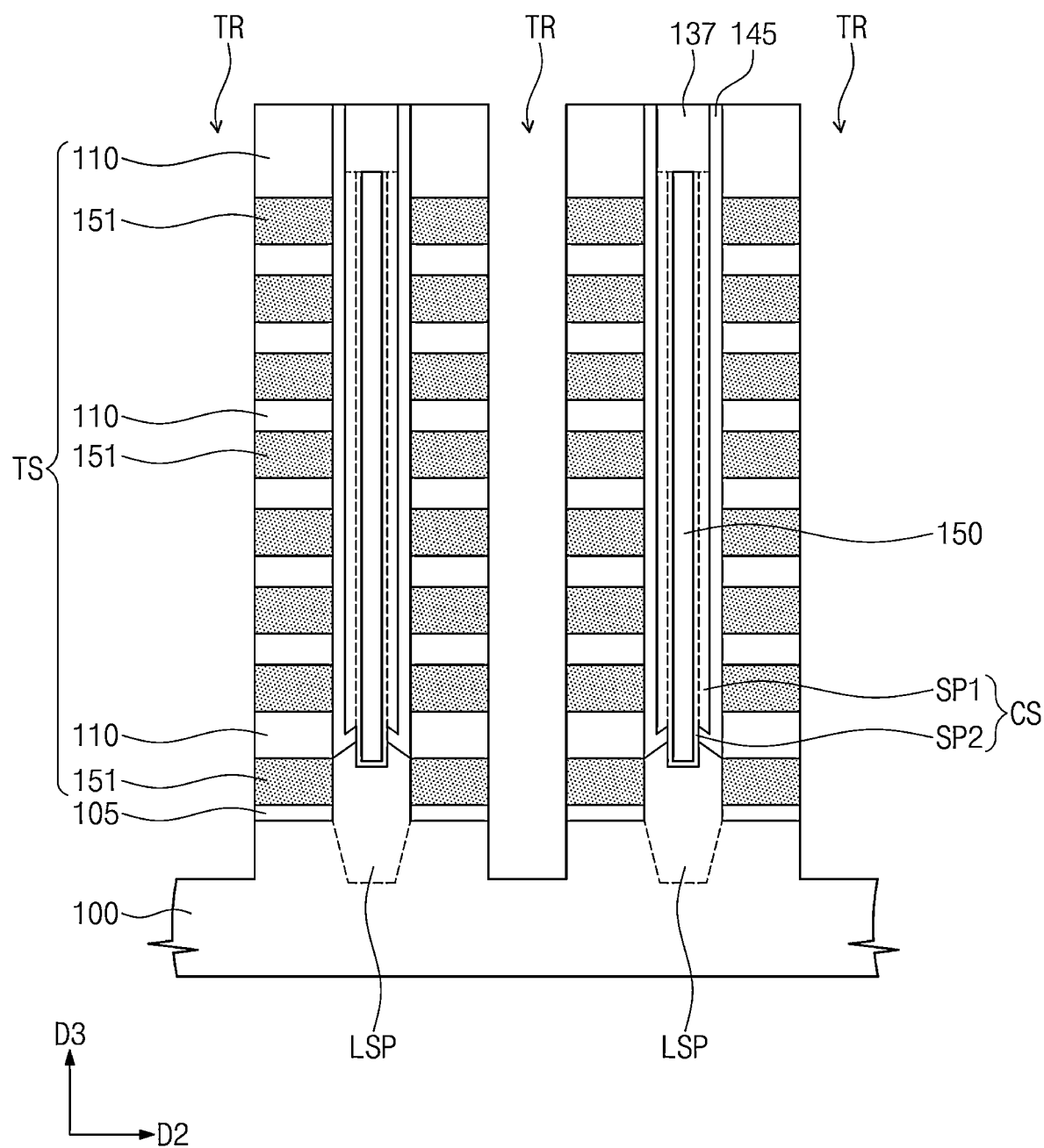

Referring to FIG. 10, the thin-layer structure TS may be patterned to form trenches T that expose the substrate 100. For example, the formation of the trenches TR may include forming second mask patterns (not shown) on the thin-layer structure TS and performing an etching process in which the second mask patterns are used as an etching mask to etch the thin-layer structure TS. The top surface of the substrate 100 may be over-etched during the etching process. Accordingly, the top surface of the substrate 100 may be recessed. After the trenches TR are formed, the second mask patterns may be removed. The trenches TR may be formed to expose sidewalls of the sacrificial layers 151 and of the dielectric layers 110.

Figure 11:
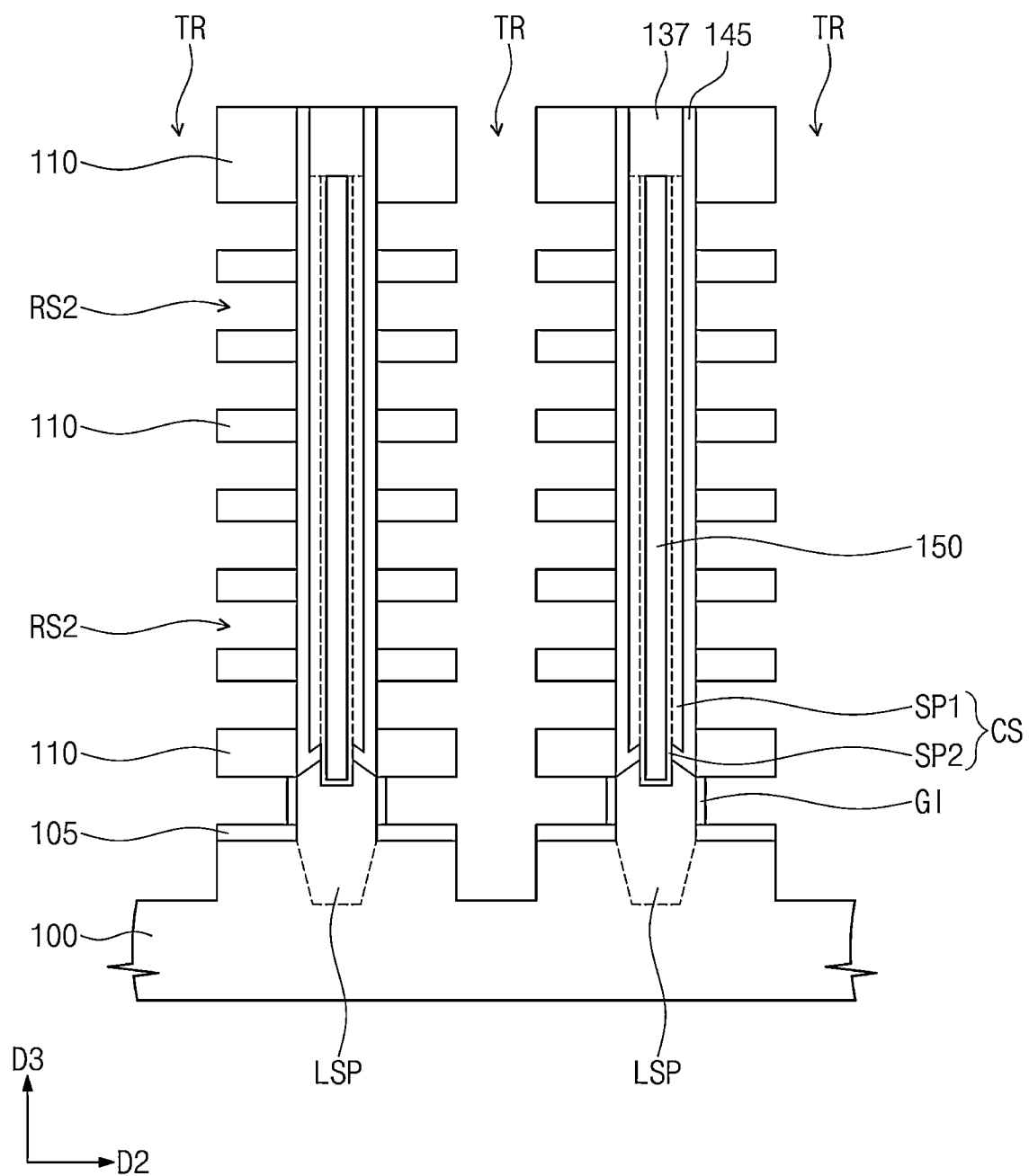

Referring to FIG. 11, second recess regions RS2 may be formed by selectively removing the sacrificial layers 151 exposed to the trenches TR. The second recess regions RS2 may be empty spaces where the sacrificial layers 151 are removed. The second recess regions RS2 may partially expose the vertical insulator 145. The second recess regions RS2 may also partially expose the lower semiconductor pattern LSP.

A gate dielectric layer GI may be formed on an exposed sidewall of each of the lower semiconductor patterns LSP. For example, the exposed sidewall of the lower semiconductor pattern LSP may undergo an oxidation process to form the gate dielectric layer GI composed of an oxide layer.

Figure 12:
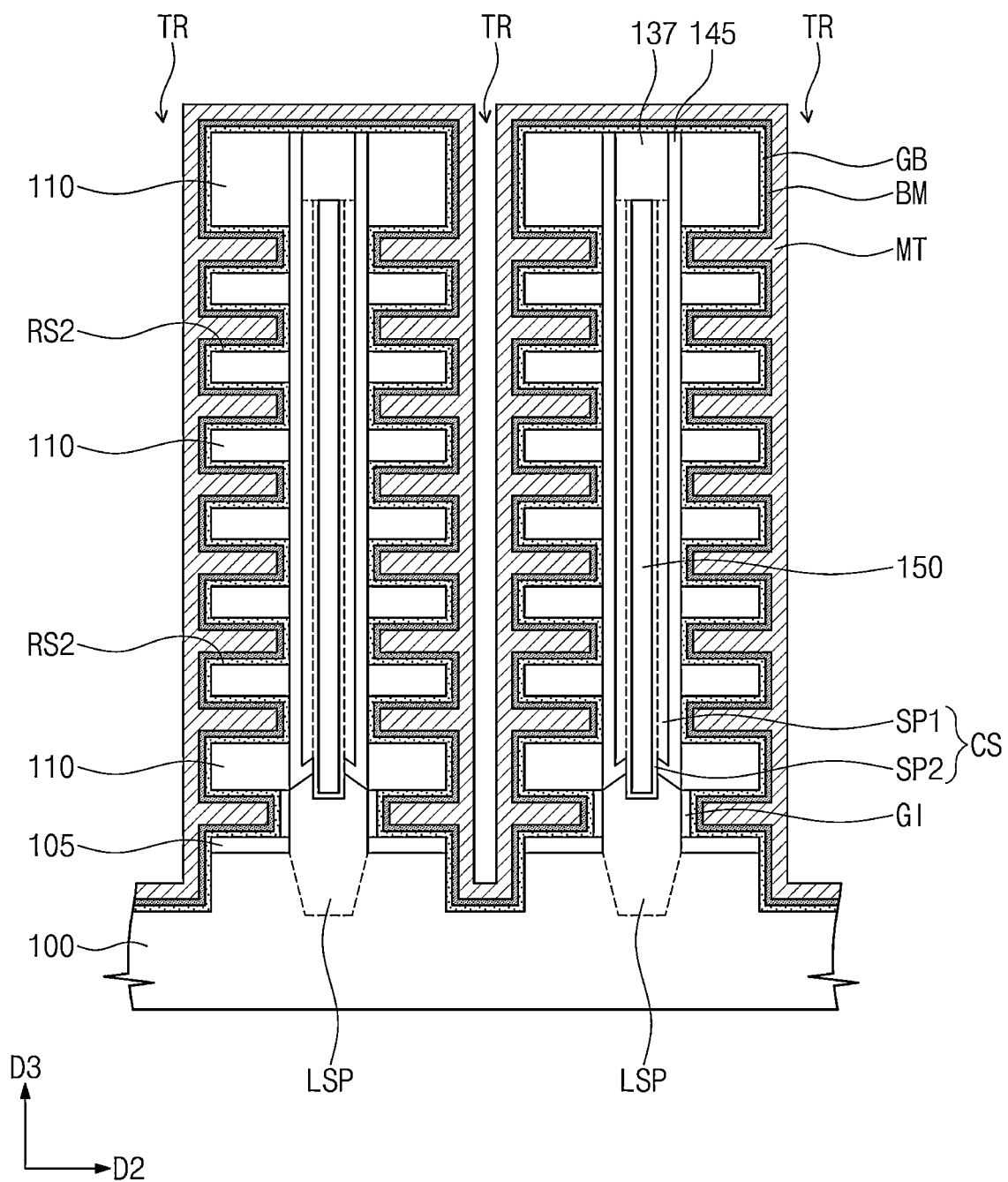

Referring to FIG. 12, a gate barrier layer GB, a metal barrier layer BM, and a metal layer MT may be sequentially formed to fill the second recess regions RS2. The gate barrier layer GB, the metal barrier layer BM, and the metal layer MT may be conformally deposited. The metal layer MT may be formed to have a thickness sufficiently enough to completely fill each of the second recess regions RS2. The metal layer MT may be formed not to completely fill each of the trenches TR.

The gate barrier layer GB may include, for example, an aluminum oxide layer or a hafnium oxide layer. The metal barrier layer BM may be, for example, a metal nitride layer, which may include, for example, one or more of a titanium nitride (TiN) layer, a tantalum nitride (TaN) layer, a tungsten nitride (WN) layer, a nickel nitride (NiN) layer, a cobalt nitride (CoN) layer, and a platinum nitride (PtN) layer. The metal layer MT may include, for example, one or more of aluminum, copper, molybdenum, and cobalt.

Figure 13:
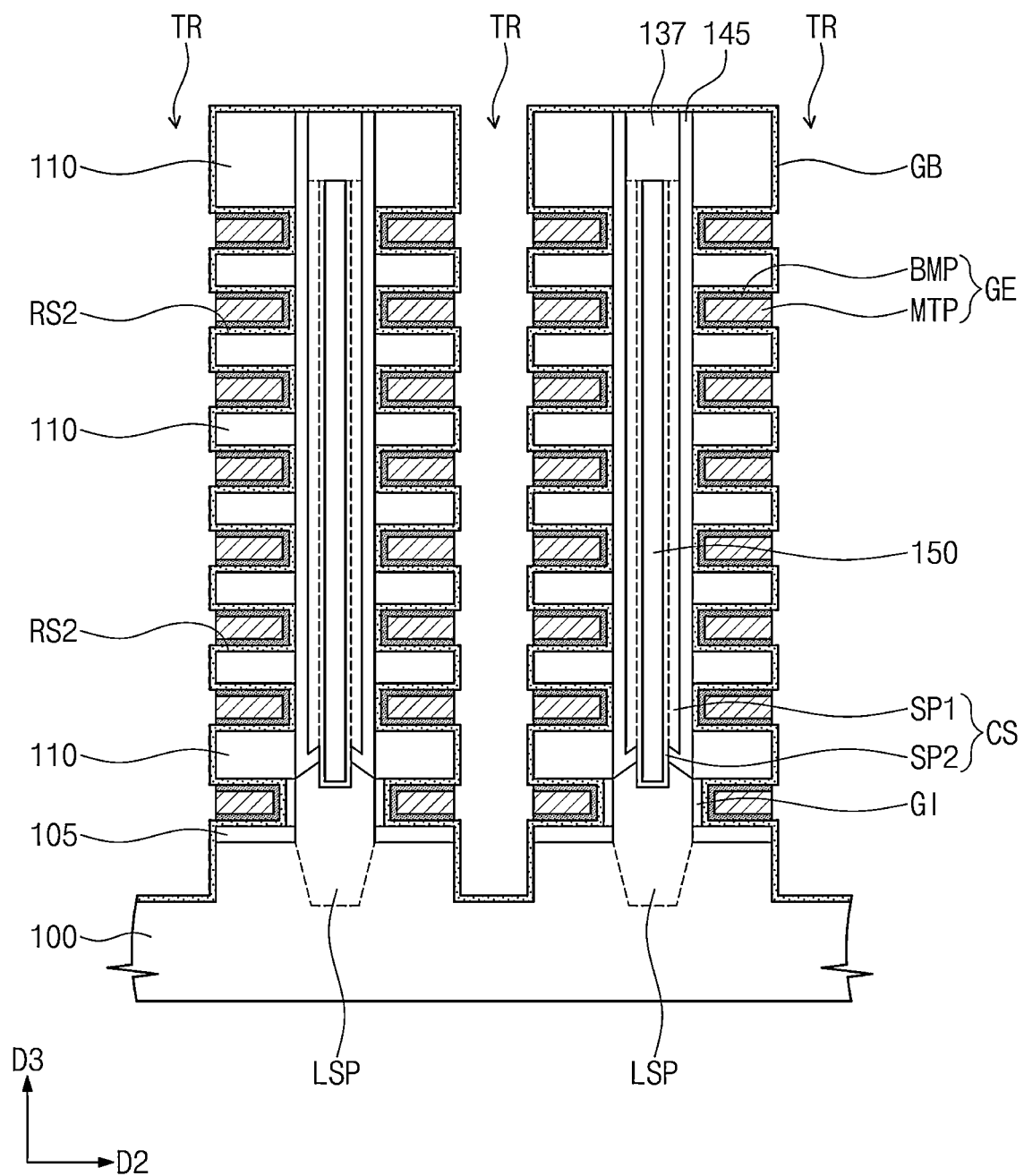

Referring to FIG. 13, the metal layer MT and the metal barrier layer BM may be etched to respectively form a metal pattern MTP and a metal barrier pattern BMP. The etching of the metal layer MT and the metal barrier layer BM may be substantially similar to the etching of the metal layer MT and the metal barrier layer BM discussed above with reference to FIGS. 1 to 3. For example, the etching of the metal layer MT and the metal barrier layer BM may include causing the trenches TR to receive therein the etching composition according to example embodiments of the present disclosure.

A gate electrode GE may be constituted by the metal pattern MTP and the metal barrier pattern BMP that are formed in each of the second recess regions RS2. The gate electrodes GE vertically adjacent to each other may be spaced apart from each other across the dielectric layer 110.

Figure 14:
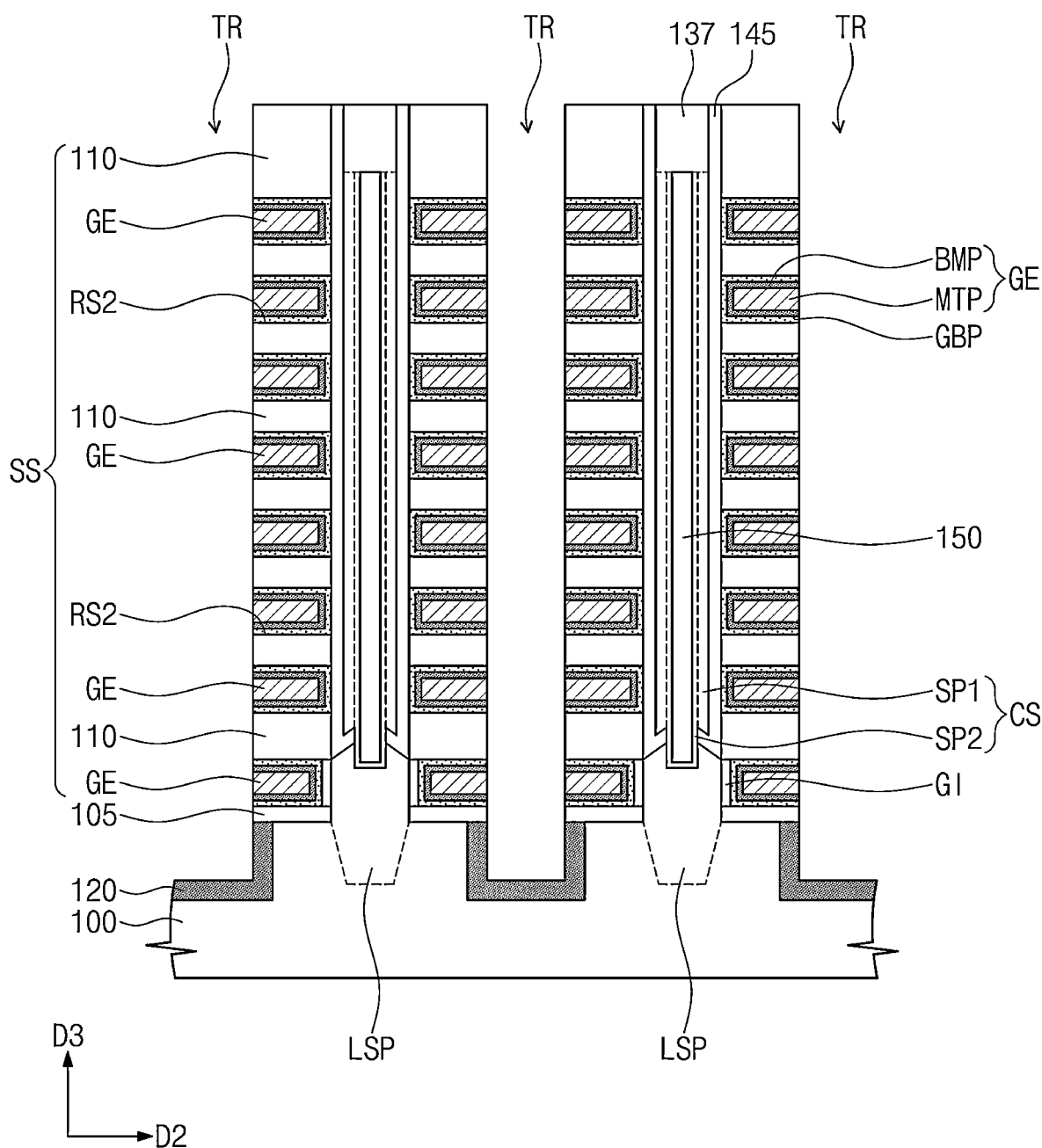
Figure 15:
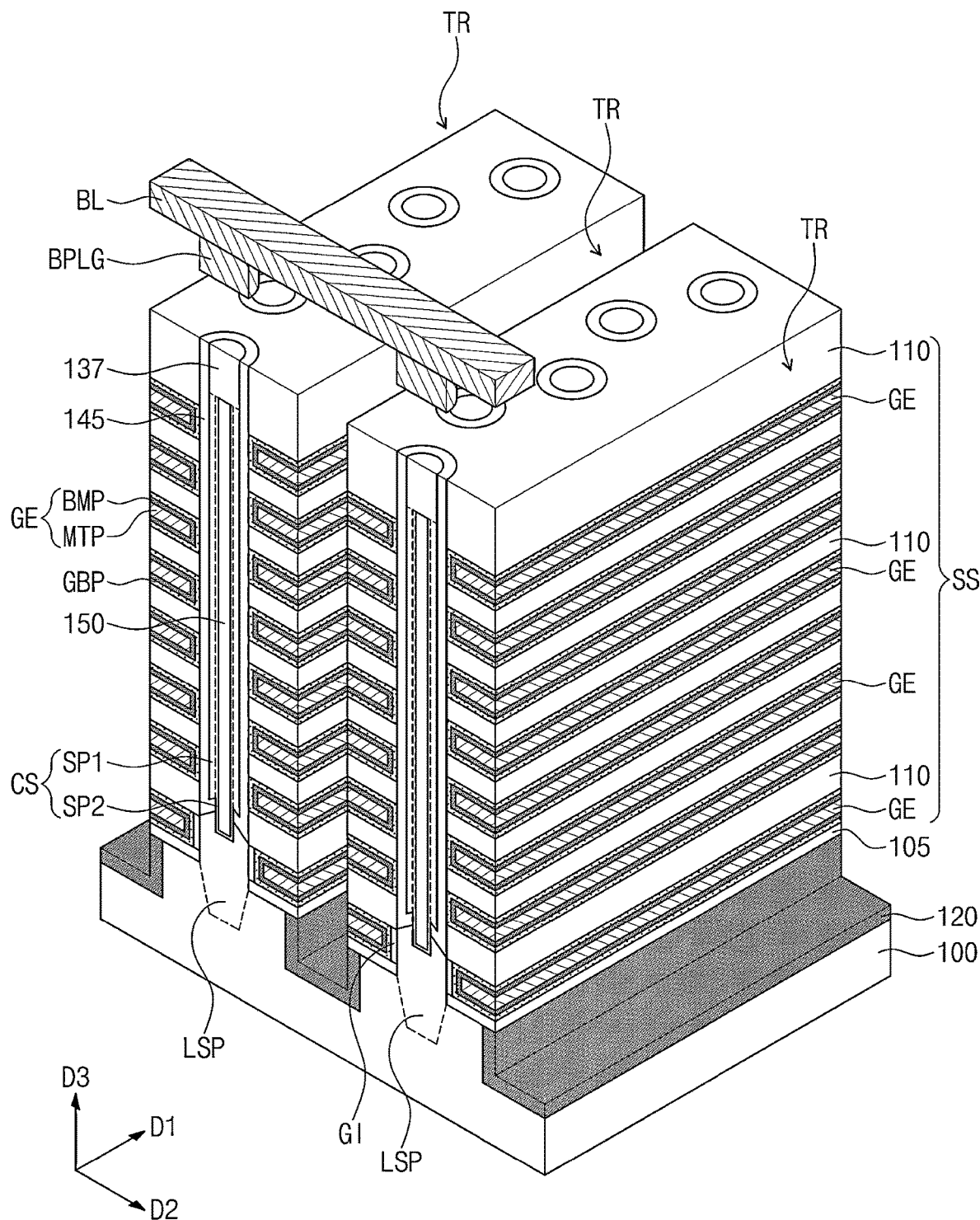
FIG. 15 illustrates a perspective view showing the semiconductor device depicted in FIG. 14.

Referring to FIGS. 14 and 15, a gate barrier pattern GBP may be formed by removing the gate barrier layer GB exposed to the trenches TR. The gate barrier pattern GBP may be interposed between the gate electrode GE and the vertical insulator 145. A stack structure SS may be constituted by the gate electrodes GE and the dielectric layers 110 that are alternately and repeatedly stacked.

Common source regions 120 may be formed in the substrate 100. The common source regions 120 may be formed by performing an ion implantation on the substrate 100 exposed to the trenches TR. The common source regions 120 may constitute PN junctions with the substrate 100.

Bit line plugs BPLG may be formed to have connection with the conductive pads 137, and a bit line BL may be formed to have connection with the bit line plugs BPLG. The bit line BL may be electrically connected through the bit line plugs BPLG to the channel structures CS.

Embodiments 4 and 5, and Comparatives 3 and 4

Below is Table 4 that lists ingredients of etching compositions according to Embodiments 4 to 5 and of etching compositions according to Comparatives 3 and 4.

TABLE 4

| Ingredient | Embodiment 4 | Embodiment 5 | Comparative 3 | Comparative 4 |
|---|---|---|---|---|
| Metal Oxide Solubilizer (phosphoric acid) | 65.8 | 65.8 | 65.8 | 65.8 |
| Oxidant (nitric acid) | 16.5 | 16.5 | 16.5 | 16.5 |
| Metal Etching Inhibitor | TEA 0.5 | EDADA 0.5 | DETA 0.5 | TETA 0.5 |
| Water | Bal. | Bal. | Bal. | Bal. |
| Sum total (wt %) | 100 | 100 | 100 | 100 |

Triethylamine (TEA) of Embodiment 4 is an amine-based compound having one nitrogen atom, which has the formula $N(CH_2CH_3)_3$, ethylenediaminediacetate (EDADA) of Embodiment 5 is an amine-based compound having two nitrogen atoms, which has the formula $NH_2CH_2CH_2NH_2 \cdot 2CH_3COOH$, diethylenetriamine (DETA) of Comparative 3 is an amine-based compound having three nitrogen atoms, which as the formula $HN(CH_2CH_2NH_2)_2$, and triethylenetetramine (TETA) of Comparative 4 is an amine-based compound having four nitrogen atoms, which has the formula $(CH_2NHCH_2CH_2NH_2)_2$.

Experiment 3

The etching compositions of Embodiments 4 and 5 and of Comparatives 3 and 4 were used to perform an etching process on the metal layer MT and the metal barrier layer BM discussed above with reference to FIGS. 12 and 13. A tungsten layer was used as the metal layer MT, and a titanium nitride layer was used as the metal barrier layer BM. SEM images were employed to ascertain sidewall profiles of the metal patterns MTP and the metal barrier patterns BMP formed by the etching process.

Figure 16A:
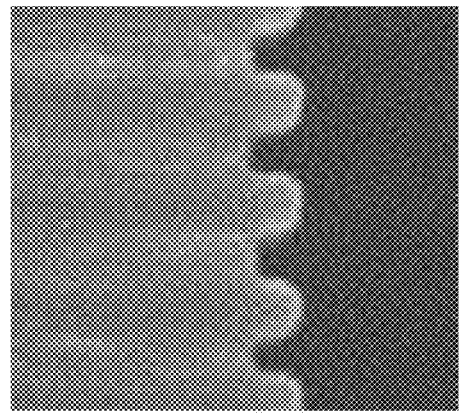
FIG. 16A illustrates an image showing a cross-section of a resultant formed by an etching process that uses the etching composition of Embodiment 4 in Table 4.
Figure 16B:
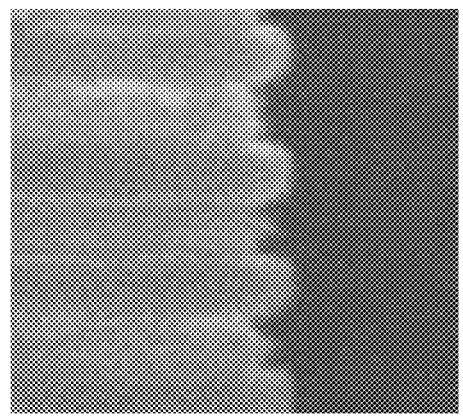
FIG. 16B illustrates an image showing a cross-section of a resultant formed by an etching process that uses the etching composition of Comparative 3 in Table 4.
Figure 17:
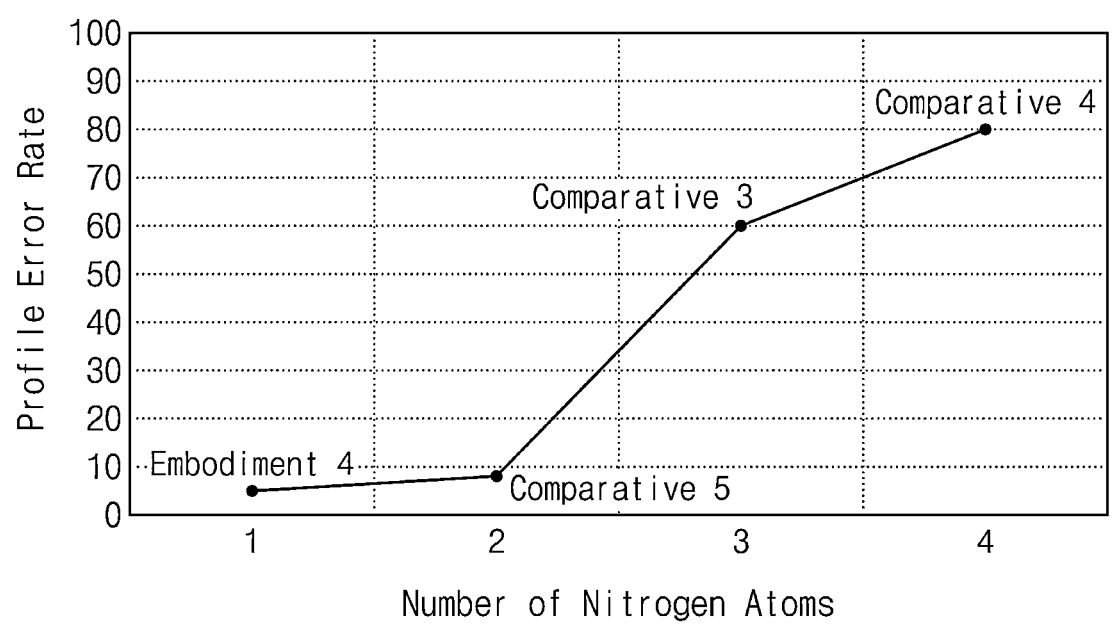
FIG. 17 illustrates a graph showing a profile error rate of a sidewall of a resultant formed by an etching process using etching compositions of Embodiments 4 and 5 and of Comparatives 3 and 4 in Table 4.

FIG. 16A illustrates an image showing a cross-section of a resultant formed by the etching process that uses the etching composition of Embodiment 4. FIG. 16B illustrates an image showing a cross-section of a resultant formed by the etching process that uses the etching composition of Comparative 3. FIG. 17 illustrates a graph showing a profile error rate of a sidewall of a resultant formed by the etching process using the etching compositions of Embodiments 4 and 5 and Comparatives 3 and 4.

Referring to FIGS. 16A and 17, it may be ascertained through the image that the metal patterns MTP and the metal barrier patterns BMP had their sidewalls smoothly formed as a result of using the etching compositions of Embodiments 4 and 5 to perform the etching process. For example, it may be found that the metal patterns MTP and the metal barrier patterns BMP formed according to some exemplary embodiments of the present disclosure had their sidewalls whose profile error rate was relatively low.

Referring to FIGS. 16B and 17, it may be ascertained through the image that the metal patterns MTP and the metal barrier patterns BMP had their sidewalls ruggedly formed as a result of using the etching compositions of Comparatives 3 and 4 to perform the etching process. For example, it may be found that the metal patterns MTP and the metal barrier patterns BMP formed according to comparative examples of the present disclosure had their sidewalls whose profile error rate was relatively high. In particular, when the metal etching inhibitor included an amine-based compound having three or more nitrogen atoms, it may be ascertained that the profile error rate was dramatically increased (see FIG. 17).

In consequence, the etching composition according to some example embodiments of the present disclosure may use an amine-based compound having two or less nitrogen atoms as the metal etching inhibitor. Accordingly, the gate electrodes GE of the semiconductor device discussed above with reference to FIGS. 14 and 15 may be formed to have good profiles without defects.

The etching composition according to the present disclosure may etch a metal barrier layer and a metal layer at relatively high rates. When the etching composition according to the present disclosure is used to etch the metal barrier layer and the metal layer, an etch selectivity between the metal barrier layer and the metal layer may be uniformly maintained for a long time.

This detailed description of the present disclosure should not be construed as limited to the exemplary embodiments set forth herein, and it is intended that the present disclosure covers the various combinations, the modifications and variations of this disclosure without departing from the spirit and scope of the present disclosure. The appended claims should be construed to include other embodiments.

What is claimed is:

1. An etching composition for etching a tungsten layer and a titanium nitride (TiN) layer, the etching composition comprising:
   an oxidant selected from the group consisting of nitric acid, bromic acid, iodic acid, perchloric acid, perbromic acid, periodic acid, sulfuric acid, methane sulfonic acid, p-toluenesulfonic acid, benzenesulfonic acid, and a combination thereof;
   a metal etching inhibitor selected from the group consisting of ethylenediaminediacetate (EDADA), m-xylylenediamine (MXDA), and a combination thereof; and
   a metal oxide solubilizer selected from the group consisting of phosphoric acid, phosphate, carboxylic acid having 3 to 20 carbon atoms, and a combination thereof,
   wherein an amount of the metal etching inhibitor is from 0.01% to 5% by weight relative to a total weight of the etching composition,
   wherein the etching composition is configured to obtain an etch selectivity of from 1.0 to 2.0, where the etch selectivity is a ratio of an etch rate of the tungsten layer to an etch rate of the titanium nitride layer, and
   wherein an amount of the oxidant is from 10% to 30% by weight relative to the total weight of the etching composition.

2. The etching composition of claim 1, wherein the metal etching inhibitor reduces the etch rate of the tungsten layer.

3. The etching composition of claim 1, further comprising water,
   wherein an amount of the water is from 10% to 30% by weight relative to the total weight of the etching composition, and
   a remainder of the etching composition is the metal oxide solubilizer.

4. The etching composition of claim 1, wherein the metal oxide solubilizer is phosphoric acid.

5. An etching composition for etching a tungsten layer and a titanium nitride (TiN) layer, the etching composition consisting essentially of:
   nitric acid as an oxidant;
   a metal etching inhibitor selected from the group consisting of triethylamine (TEA), ethylenediaminediacetate (EDADA), m-xylylenediamine (MXDA), and a combination thereof;
   phosphoric acid as a metal oxide solubilizer; and
   water,
   wherein an amount of the water is from 10% to 30% by weight relative to a total weight of the etching composition,
   an amount of the oxidant is from 10% to 30% by weight relative to the total weight of the etching composition,
   an amount of the metal etching inhibitor is from 0.01% to 10% by weight relative to the total weight of the etching composition, and
   a remainder of the etching composition is the metal oxide solubilizer.

6. The etching composition of claim 5, wherein the etching composition has an etch selectivity of from 1.0 to 2.0, where the etch selectivity is a ratio of an etch rate of the tungsten layer to an etch rate of the titanium nitride layer.

* * * * *